(12) United States Patent
Yamamoto et al.

(10) Patent No.: US 6,629,289 B2
(45) Date of Patent: Sep. 30, 2003

(54) TIMING VERIFYING SYSTEM IN WHICH WAVEFORM SLEW IS CONSIDERED

(75) Inventors: Miyuki Yamamoto, Tokyo (JP); Tetsuya Akimoto, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 453 days.

(21) Appl. No.: 09/745,941

(22) Filed: Dec. 22, 2000

(65) Prior Publication Data

US 2001/0005898 A1 Jun. 28, 2001

(30) Foreign Application Priority Data

Dec. 22, 1999 (JP) .................................. 11-365346

(51) Int. Cl.[7] .................. G06F 11/00; H03K 5/12; H03K 11/26
(52) U.S. Cl. .................. 714/815; 327/170; 327/290
(58) Field of Search .................. 714/815; 727/170, 727/290

(56) References Cited

U.S. PATENT DOCUMENTS 5,852,445 A * 12/1998 Yoshikawa et al. ......... 345/440
6,219,822 B1 * 4/2001 Gristede et al. ............... 716/10
6,249,901 B1 * 6/2001 Yuan et al. ..................... 716/5
6,298,465 B1 * 10/2001 Klotchkov .................. 714/814

FOREIGN PATENT DOCUMENTS

JP         9-179888         11/1997

OTHER PUBLICATIONS

Jun et al. (An efficient timing simulation approach for CMOS digital circuits), IEEE. 1991.*

* cited by examiner

Primary Examiner—David Ton
Assistant Examiner—Esaw T Abraham
(74) Attorney, Agent, or Firm—Scully, Scott, Murphy & Presser

(57) ABSTRACT

In a method for verifying a timing at an object logic cell between a first signal and a second signal in a logic circuit with a plurality of logic cells including the object logic cell, there are determined first delay data of the first signal from a first external input terminal to the object logic cell, first waveform slew data of the first signal to the object logic cell and first signal data indicating a frequency, duty ratio and jitter of the first signal and a second waveform slew data of the second signal to the object logic cell. A first portion of a first waveform of the first signal and a second portion of a second waveform of the second signal is calculated in time then it is determined whether the first portion of the first waveform overlaps the second portion of the second waveform.

23 Claims, 6 Drawing Sheets

| | WAVEFORM DISTORTION REFERENCE VALUE | |
|---|---|---|
| | CELL M | CELL N |
| $(C_1, R_1)$ | | |
| $(C_1, R_2)$ | WORST | |
| $(C_2, R_1)$ | | |
| $(C_2, R_2)$ | | WORST |

TIMING VERIFYING SYSTEM IN WHICH WAVEFORM SLEW IS CONSIDERED

BACKGROUND OF THE INVENTION

1. Field of the Invention

The present invention relates to an apparatus and method for verifying timing between signals.

2. Description of the Related Art

In a logic circuit, a common signal is used for data latch. As the common signals, there are timing signals such as a clock signal, a set signal, and a reset signal. The clock signal undergoes physical influence from a lot of logic cells in the logic circuit while being propagated in the circuit so that the waveform is made dull. A data signal is delayed due to logical cells and wiring line capacitance until the data signal reaches a target logic cell while being propagated in the logic circuit after being inputted from an input terminal of the logic circuit. The data signal is generally latched by a latch circuit at a rising edge or falling edge of the clock signal. For example, when a data signal whose logical value changes immediately before a latch timing should be latched by a latch circuit, the latch condition is the most severe. Under such a condition, when the slew of signal waveform is too large, it is not possible to correctly latch the data signal even if the data signal arrives.

A technique for the timing verification of the difference between the arrival time of the data signal and the arrival time of the clock signal is disclosed in Japanese Laid Open Patent Application (JP-A-Heisei 9-179888). For the technique, it is important to verify the difference between a waveform with slew and another waveform with no slew. If the arrival time of the clock signal and the arrival time of the data signal are the same even if the signals are delayed, the delay does not become hindrance at all for the operation of a computer. However, if the signal waveform is dully changed so that the signal does not over a threshold voltage, a logic cell operates erroneously.

Figure 1:
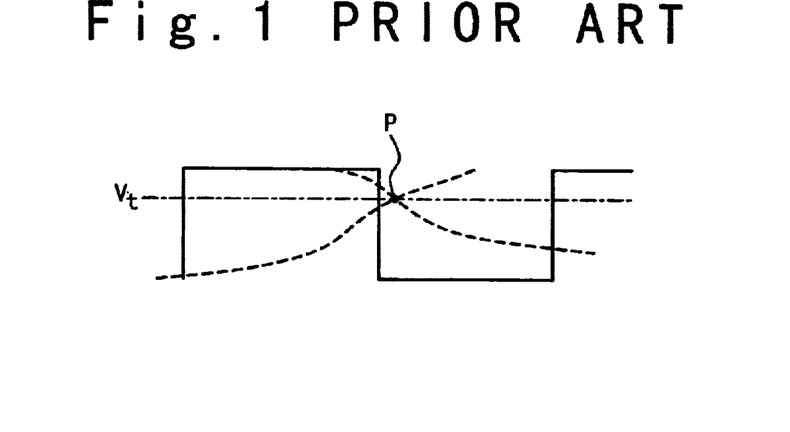
FIG. 1 is a diagram showing a signal with an ideal waveform and a signal with a slew.

FIG. 1 shows the relation of a normal clock signal with no slew and a clock signal with slew. The solid line waveform shows the ideal waveform with no slew of the normal clock signal. The rising edge or falling edge of the normal signal is used as the timing at which the data signal is latched. The dotted line waveform shows a signal waveform with slew of the normal clock signal. The threshold voltage is shown by one chain line. When the signal waveform of the clock signal exceeds the threshold voltage Vth at the point P, the data signal is latched. However, when the clock signal passes away a desired latch timing, in other words, the timing that the data signal should be latched is missed, the data signal cannot be correctly latched by the latch. The delay time between the ideal rising timing of the clock signal and the actual rising timing of the clock signal (point P) is defined as the slew time of the clock signal.

Figure 2:
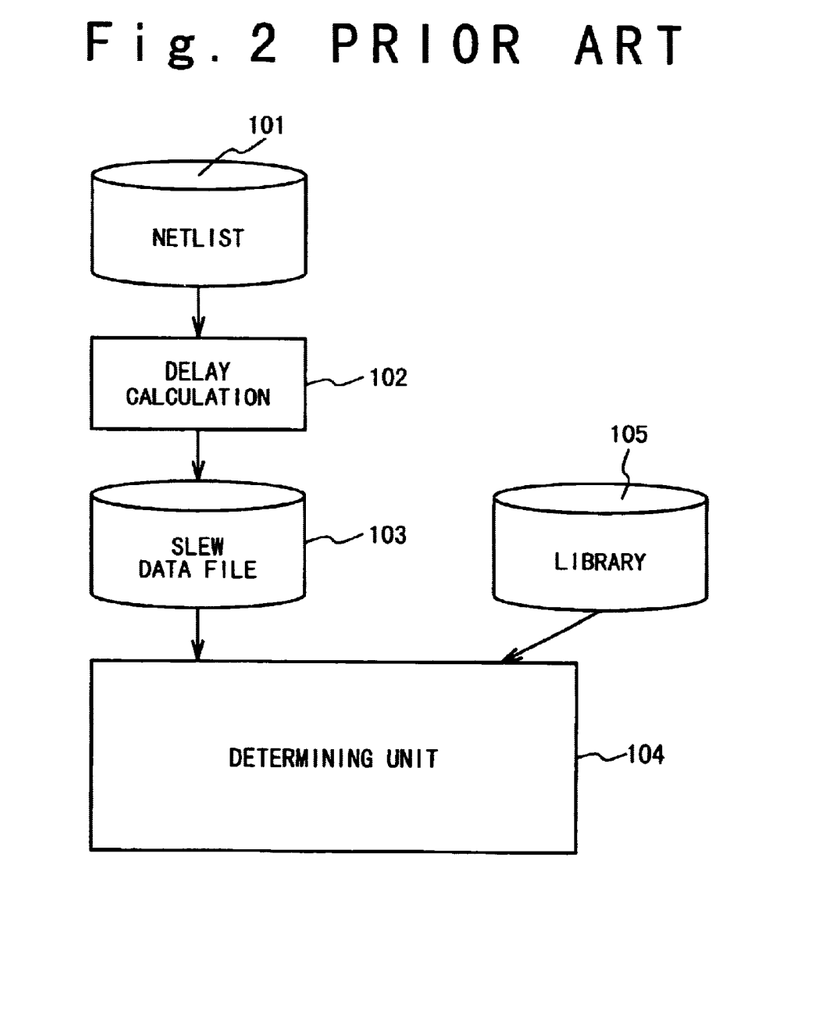
FIG. 2 is a block diagram showing a conventional simulator.
Figure 3:
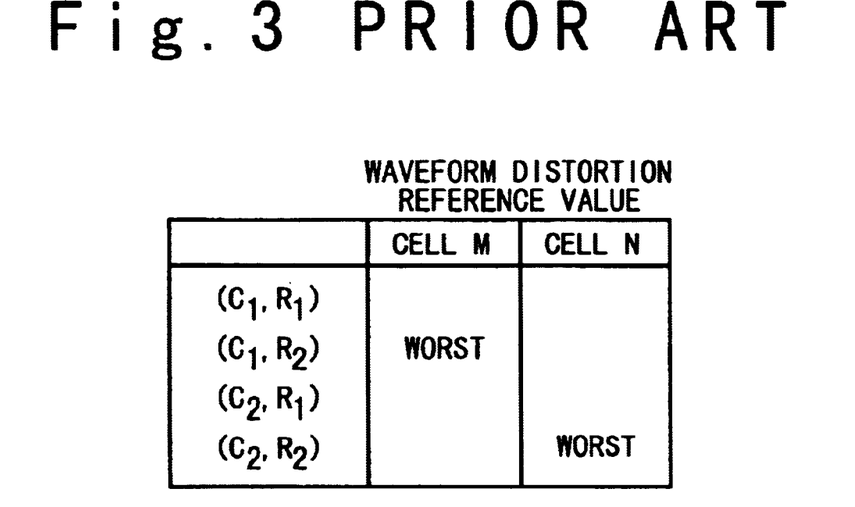
FIG. 3 is a table stored in a library of the conventional simulator.
Figure 4:
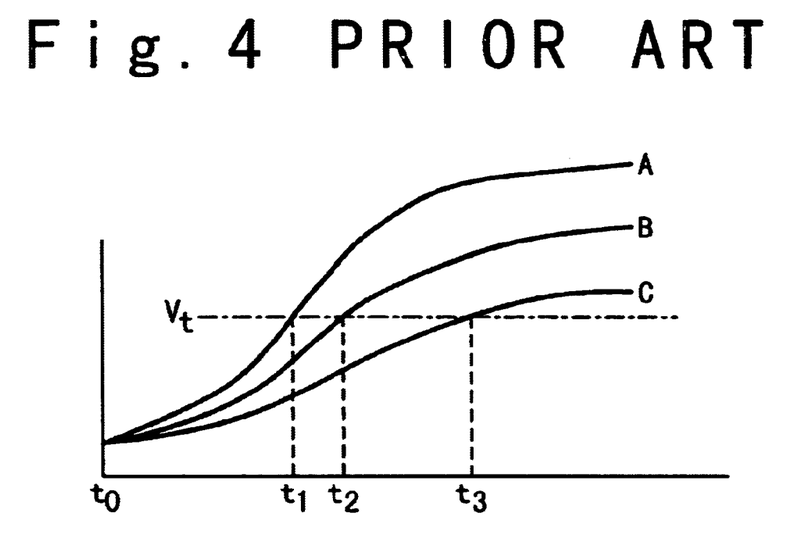
FIG. 4 is graphs of waveforms with different sets of resistor and capacitance in the conventional simulator.

FIG. 2 shows a conventional simulator, which is used for circuit design of a logic circuit in consideration of the slews of the signals. As shown in FIG. 2, the conventional simulator is composed of a library 105, which stores slews or slews of signals for every unit logic cell. The slews are represented by a 2-variable function of a capacitance C and a resistance R. When a reference value of a threshold value is set, the latch times for the signal waveforms with the slews A, B and C shown in FIG. 4 are determined to be the times t1, t2 and t3, respectively. Thus, the library 105 stores the relation between a set of the capacitance Cj and the resistance Rk and the delay time until the signal waveform exceeds the threshold value. Also, FIG. 3 shows the maximum slew of the signal waveform permissible in the circuit is stored in the library 105 as the worst value. The worst value has no dependence on frequency.

As shown in FIG. 2, the conventional simulator is composed of a net list 101, a delay calculator 102, a slew data file 103, and a determining unit 104. The slew of the signal waveform is calculated using a well known equation for the slew of a signal waveform. When the calculated slew of the signal waveform is larger at a logic cell than the worst value stored in the library 105, a circuit using the logic cell is determined to operate erroneously. The conventional simulator carries out an error determination based on the peculiar worst value of the slew for each logic cell without consideration of a frequency of the clock signal.

SUMMARY OF THE INVENTION

Therefore, an object of the present invention is to provide a system and method for verifying timing between signals under the consideration of the delay and slew of the signals.

In an aspect of the present invention, a method for verifying a timing at an object logic cell between a first signal and a second signal in a logic circuit with a plurality of logic cells including the object logic cell, is attained by (a) determining first delay data of the first signal from a first external input terminal to the object logic cell, first waveform slew data of the first signal to the object logic cell and first signal data indicating a frequency, duty ratio and jitter of the first signal, and a second delay data, a second waveform slew data and second signal data indicating a frequency, duty ratio and jitter of the second signal to the object logic cell; by (b) calculating in time, a first portion of a first waveform of the first signal at the object logic cell based on the first delay data, the first waveform slew data and the first signal data; by (c) calculating in time, a second portion of a second waveform of the second signal at the object logic cell based on the second delay data, the second waveform slew data and the second signal data; and by (d) evaluating whether the first portion of the first waveform overlaps the second portion of the second waveform.

Here, the (a) determination may be attained by (e) providing first to third tables, wherein the first table stores delay data associated with signals in the logic circuit, the second table stores waveform slew data associated with the signals in the logic circuit, and the third table previously stores signal data of a frequency, duty ratio and jitter associated with at least one of the signals in the logic circuit; and by (f) referring to the first table the based on the first signal and the second signal to determine the first delay data of the first signal and the second delay data of the second signal from the delay data stored in the first table, respectively, to the second table the based on the first signal and the second signal to determine the first waveform slew data of the first signal and the second waveform slew data of the second signal from the waveform slew data stored in the second table, respectively, and to the third table the based on the first and second signals to determine the first and second signal data from the signal data stored in the third table, respectively.

Also, the (a) determination may be additionally attained by (g) providing a fourth table storing net list data indicative of the logic circuit by signal paths and the logic cells; by (h) previously calculating the delay data and the waveform slew data for each of the signal paths and the plurality of logic cells based on the net list data to store in the first and second tables, respectively.

Also, the (f) referring may be attained by (i) tracing a first transfer path of the first signal from the first external input terminal to the object logic cell using the net list data; by (j) tracing a second transfer path of the second signal from a second external input terminal to the object logic cell using the net list data; by (k) calculating the first delay data of the first signal based on the delay data stored in the first table, the first signal data and the first transfer path; by (l) calculating the first waveform slew data of the first signal based on the waveform slew data stored in the second table, the first signal data and the first transfer path; by (m) calculating the second delay data of the second signal based on the delay data stored in the first table, the second signal data and the second transfer path; and by (n) calculating the second waveform slew data of the second signal based on the waveform slew data stored in the second table and the second transfer path.

Also, the (b) calculation may be attained by calculating a first minimum falling time, a first maximum falling time, a first minimum rising time, and a first maximum rising time for the first portion of the first signal waveform of the first signal at the object logic cell based on the first delay data, the first slew data and the first signal data. The (c) calculation may be attained by calculating a second minimum falling time, a second maximum falling time, a second minimum rising time, and a second maximum rising time for the second portion of the second waveform of the second signal at the object logic cell based on the second slew data.

In this case, the first portion of the first waveform may be defined as (the first minimum falling time)–(the first maximum rising time), the second portion of the second waveform may be defined as (the second minimum falling time)–(the second maximum rising time). Also, the first portion of the first waveform may be defined as (the first minimum falling time)–(the first maximum rising time), and the second portion of the second waveform may be defined as (the second minimum rising time)–(the second maximum falling time). Also, the first portion of the first waveform may be defined as (the first minimum rising time)–(the first maximum falling time), and the second portion of the second waveform may be defined as (the second minimum falling time)–(the second maximum rising time). Otherwise, the first portion of the first waveform may be defined as (the first minimum rising time)–(the first maximum falling time), and the second portion of the second waveform may be defined as (the second minimum rising time)–(the second maximum falling time).

In order to achieve another aspect of the present invention, a system for verifying a timing at an object logic cell between a first signal and a second signal in a logic circuit with a plurality of logic cells including the object logic cell, includes first to third tables and an evaluating unit. The first table stores delay data associated with signals in the logic circuit. The second table stores waveform slew data associated with the signals in the logic circuit. The third table previously stores signal data of a frequency, duty ratio and jitter associated with at least one of the signals in the logic circuit. The evaluating unit refers to the first table based on the first signal and the second signal to determine first delay data of the first signal and the second delay data of the second signal from a first external input terminal to the object logic cell from the delay data stored in the first table, respectively, to the second table the based on the first signal and the second signal to determine the first waveform slew data of the first signal to the object logic cell and the second waveform slew data of the second signal to the object logic cell from the waveform slew data stored in the second table, respectively, and to the third table based on the first and second signals to determine the first and second signal data from the signal data stored in the third table, respectively. Also, the evaluating unit calculates in time, a first portion of a first waveform of the first signal at the object logic cell based on the first delay data, the first waveform slew data and the first signal data. Further, the evaluating unit calculates in time, a second portion of a second waveform of the second signal at the object logic cell based on the second delay data, the second waveform slew data and the second signal data, and evaluates whether the first portion of the first waveform overlaps the second portion of the second waveform.

In this case, the system may further include a fourth table which stores net list data indicative of the logic circuit by signal paths and the logic cells. The evaluating unit previously calculates the delay data and the waveform slew data for each of the signal paths and the plurality of logic cells based on the net list data to store in the first and second tables, respectively.

Also, the evaluating unit may:

trace a first transfer path of the first signal from the first external input terminal to the object logic cell using the net list data, trace a second transfer path of the second signal from a second external input terminal to the object logic cell using the net list data;

calculates the first delay data of the first signal based on the delay data stored in the first table, the first signal data and the first transfer path;

calculates the first waveform slew data of the first signal based on the waveform slew data stored in the second table, the first signal data and the first transfer path;

calculates the second delay data of the second signal based on the delay data stored in the first table, the second signal data and the second transfer path; and calculates the second waveform slew data of the second signal based on the second delay data, the waveform slew data stored in the second table and second transfer path.

Also, the evaluating unit may:

calculate a first minimum falling time, a first maximum falling time, a first minimum rising time, and a first maximum rising time for the first portion of the first signal waveform of the first signal at the object logic cell based on the first delay data, the first slew data and the first signal data, and calculate a second minimum falling time, a second maximum falling time, a second minimum rising time, and a second maximum rising time for the second portion of the second waveform of the second signal at the object logic cell based on the second slew data.

In this case, the evaluating unit whether the first portion of the first waveform overlaps the second portion of the second waveform in time, based on one of (the first minimum falling time)–(the first maximum rising time) and (the first maximum rising time)–(the first minimum falling time) and one of (the second minimum falling time)–(the second maximum rising time) and (the second maximum rising time)–(the second minimum falling time).

In order to achieve still another aspect of the present invention, a recording medium is provided in which a program is recorded for a method for verifying a timing at an object logic cell between a first signal and a second signal in a logic circuit with a plurality of logic cells including the object logic cell. The method is attained by (a) determining first delay data of the first signal from a first external input terminal to the object logic cell, first waveform slew data of the first signal to the object logic cell and first signal data indicating a frequency, duty ratio and jitter of the first signal, and a second waveform slew data and second signal data indicating a frequency, duty ratio and jitter of the second signal to the object logic cell; by (b) calculating in time, a first portion of a first waveform of the first signal at the object logic cell based on the first delay data, the first waveform slew data and the first signal data; by (c) calculating in time, a second portion of a second waveform of the second signal at the object logic cell based on the second delay data, the second waveform slew data and the second signal data; and by (d) evaluating whether the first portion of the first waveform overlaps the second portion of the second waveform.

DESCRIPTION OF THE PREFERRED EMBODIMENTS

Hereinafter, a system and method for verifying timing between signals of the present invention.

Figure 5:
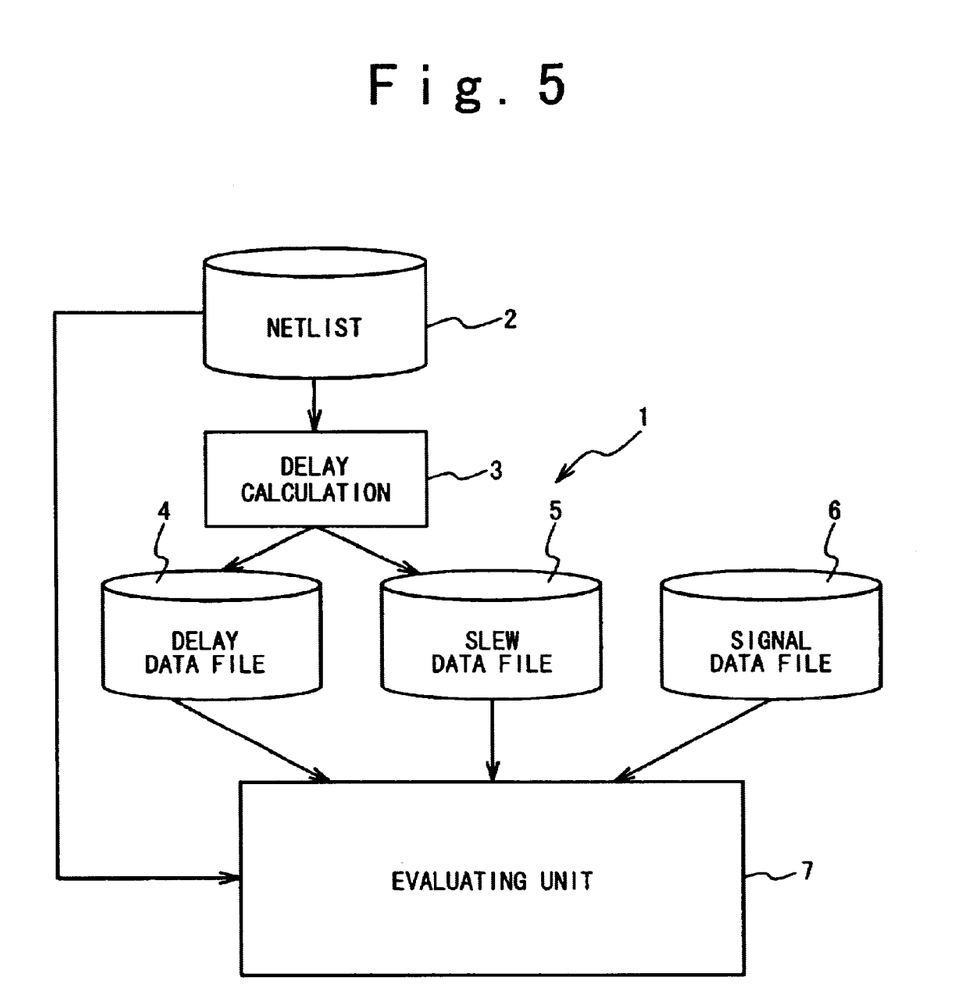
FIG. 5 is a timing verifying system of the present invention.

FIG. 5 shows the structure of the timing verifying system according to an embodiment of the present invention. Referring to FIG. 5, the timing verifying system is composed of a net list 2, a delay calculating unit 3, a delay data file 4, a slew data file 5, a signal data file 6 and an evaluating unit 7. Here, at least a part of the data and a control flow may be provided in the form of a recording medium.

The net list 2 stores circuit data such as logic cells and connection data between the logic cells, connection data from each of external input terminals to a corresponding one of the logic cells, connection data from each of last ones of the logic cells to a corresponding one of external output terminals. The net list 2 may store signals supplied to the external input terminals.

The delay calculator 3 is connoted to the net list 2. The delay calculator 3 calculates a signal delay and slew for every connection data and for every logic cell. The delay calculator 3 stores the calculated delay in the delay data file 4 in association with the connection data or logic cell and the calculated slew in the slew data file 5 in association with the connection data or logic cell. The slew of the signal waveform is calculation from a well known equation for calculating the slew of the signal waveform.

The signal data file 6 stores a frequency, duty ratio and jitter of each of the signals. The evaluating unit 7 evaluates whether a timing between a data signal supplied to an object one of the logic cells and a clock signal supplied to the object logic cell is proper or improper. In other words, the evaluating unit 7 evaluates whether a predetermined signal portion of the waveform of the data signal and a predetermined signal portion of the waveform of the clock signal overlap with each other.

In this case, for example, it supposes that a data signal shown in FIG. 1 by a solid line is a signal with no slew to be latched by a latch. When the high pulse portion of the data signal is latched at the rising edge of the clock signal, the rising edge of the clock signal should be made delayed later than the rising edge of the high pulse portion, because it is necessary to take a data set up time. In this case, however, if the rising edge of the clock signal is made dull so that it has reached a P point slowly, the data signal has already gone to the low pulse portion. Therefore, a latching operation is erroneously carried out. In the present invention, the permission of the slew of the clock signal is determined in such a condition. In other words, it is determined that the slew of the signal waveform is improper, when the point P has crossed a pulse width of the data signal.

Figure 6:
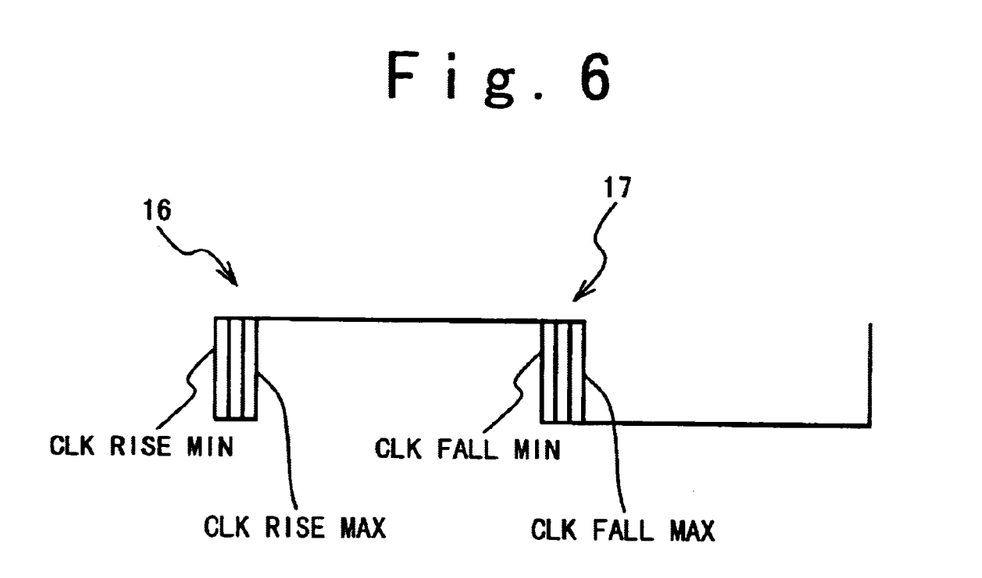
FIG. 6 is a diagram showing a minimum rising time, maximum rising time, minimum falling time and maximum falling time of a clock signal in the present invention.

In this way, the following times are defined, with reference to FIG. 6

ClkRiseMax: the maximum time of the rising edge of the clock signal (a target specification value supplied to the tool)

ClkRiseMin: the minimum time of the rising edge of the clock signal (a target specification value supplied to the tool)

ClkFallMax: the maximum time of the falling edge of the clock signal (a target specification value supplied to the tool)

ClkRiseMin: the minimum time of the falling edge of the clock signal (a target specification value supplied to the tool)

FIG. 6 shows the times ClkRiseMax, ClkRiseMin, ClkFallMax and ClkRiseMin of the clock signal. It is not possible to avoid jitter 16 between the maximum time of rising edge ClkRiseMax and the minimum time of rising edge ClkRiseMin. Also, it is not possible to avoid jitter 17 between the maximum time of falling edge ClkFallMax and the minimum time of falling edge ClkRiseMin in the clock signal.

The evaluating unit 7 calculates a total delay quantity from each of the external input terminals to a corresponding one of the logic cells while referring to the delay data file 4 based on a signal transfer path. An error of the delay quantity is previously set. The following delay quantity is defined:

TpdRiseWorst: the maximum value in the delay on the signal transfer path from the external input terminal to an input terminal of the object logic cell when the clock signal rises, TpdRiseBest: the minimum value in the delay on the signal transfer path from the external input terminal to the input terminal of the object logic cell when the clock signal rises, TpdFallWorst: the maximum value in the delay on the signal transfer path from the external input terminal to the input terminal of the object logic cell when the clock signal falls, and TpdFallBest: The minimum value in the delay on the signal transfer path from the external input terminal to the input terminal of the object logic cell when the clock signal falls.

Figure 7:
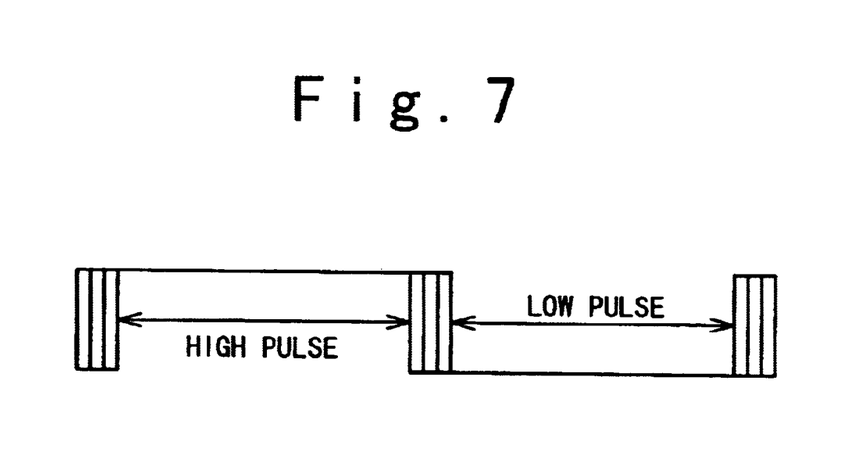
FIG. 7 is a diagram showing a high level duration and a low level duration of the clock signal.

Also, the following four quantities are defined about the rising edge and falling edge of the clock signal based on the total delay quantity and the jitters:
The maximum rising time=ClkRiseMax+TpdRiseWorst
The minimum rising time=ClkRiseMin+TpdRiseBest
The maximum falling time=ClkFallMax+TpdFallWorst
The minimum falling time=ClkFallMin+TpdFallBest
Also, the width HighPulse when the portion of the clock signal in the High level is the narrowest and the width Lowpulse that the portion of the clock signal in the low level is the narrowest are defined by the following equations, as shown in FIG. 7.

*HighPuls*=(the minimum falling time)−(the maximum rising time)

*Lowpulse*=(the minimum rising time)+(period)−(the maximum falling time)

where the period in the above equation is defined about the case where there is no flip-flop (F/F) in the signal transfer path from the external input terminal to the input terminal of the object logic cell, and is equivalent to one period of the clock signal. The period when there are n flip-flops (n is a natural number) in the signal transfer path from the external input terminal to the input terminal of the object logic cell is (period $\times 2^{n-1}$). The maximum falling time and the minimum falling time which are defined in the above equations are rewritten as follows:

The maximum falling time=*ClkFallMax+TpdFallWorst*+Period

The minimum falling time=*ClkFallMin+TpdFallBest*+Period

The following criterions are rational as to whether the clock signal is proper or improper.
  improper: if HighPulse $\leq$ TrfRise
  proper: if Lowpulse<TrfFall
where TrfRise is the calculated slew of the signal waveform when the clock signal rises at the input terminal of the object logic cell, and TrfFall is the calculated slew of the signal waveform when the signal falls at the input terminal of the object logic cell.

The above evaluation indicates that the design is proper when the minimum pulse width with frequency dependence to which both of the jitter and the delay are introduced is not smaller than the slew of the signal waveform with correlation with the delay.

Also, in the above case, it is supposed that a signal portion of a high level is latched by the rising edge of the clock signal. Here, it could be understood to the skilled person in the art that the above relations can be modified when the signal portion of the high or low level is latched by the rising or falling edge of the clock signal.

Figure 8:
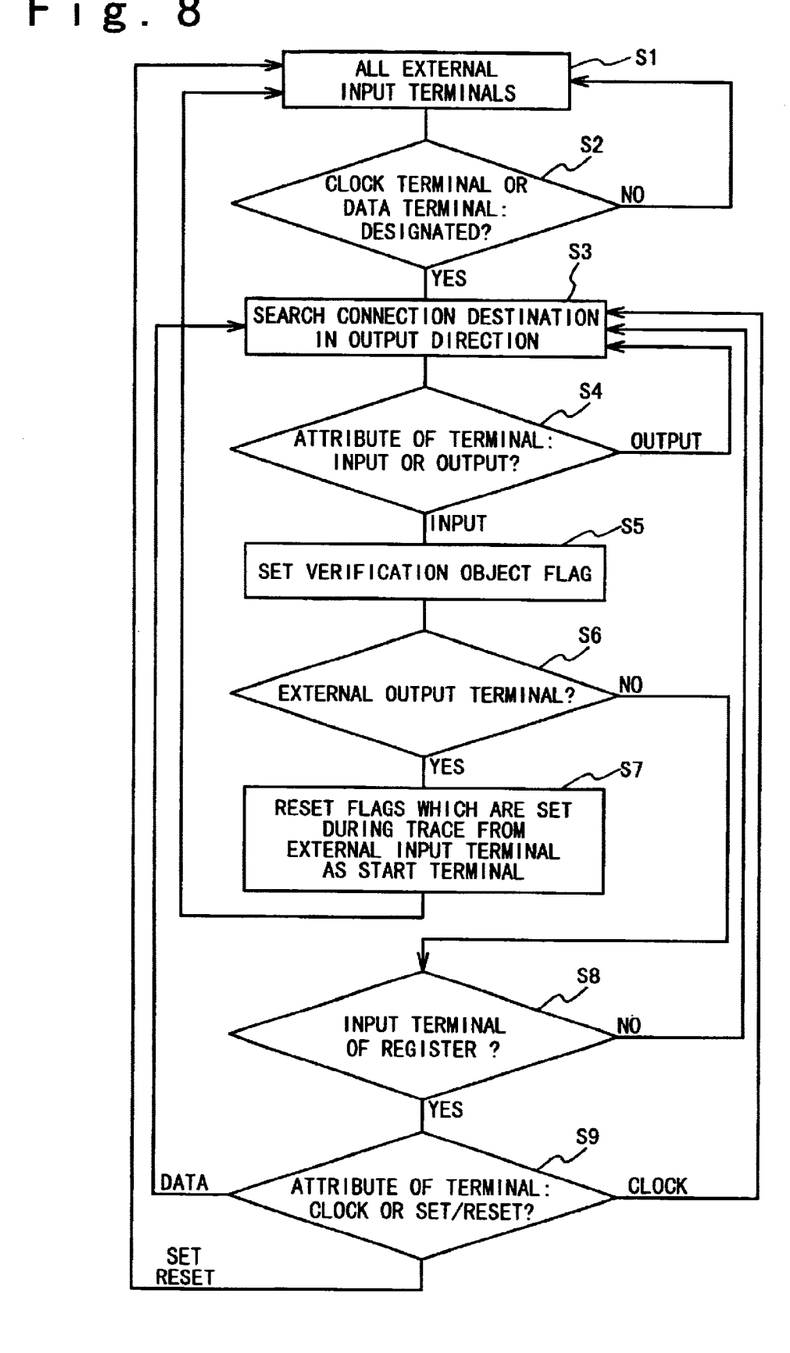
FIG. 8 is a flow chart showing a method of extracting a signal transfer path.

FIG. 8 shows a method of extracting a signal transfer path of a circuit as verification object in the evaluating unit 7.

First, it is determined whether a verification object terminal to which a signal is externally supplied is a control (clock) signal terminal, a data signal terminal or a terminal other than the above terminals (Steps S1 and 2). Subsequently, a signal transfer path is traced from the verification object terminal into the output direction based on the net list data stored in the net list 2 (Step S3). Subsequently, the attribute of the traced terminal to which the signal should be transferred is determined (Step S4). That is, it is determined whether the attribute of the traced terminal is an input terminal or an output terminal. In this case, if the traced terminal is the output terminal, the flow goes back to the step S3. If the traced terminal is an input terminal, a step S5 is carried out.

At the step S5, a verification object flag is set to indicate that the traced terminal is the input terminal. If the traced terminal is an external output terminal, the output terminal is excluded from the determination in this case. That is, if the traced terminal is the external output terminal (Y at Step S6), the verification object flag is reset which has been set at the step 5 (step S7). Then, the control flow returns to the step S1, when the traced terminal is the external output terminal.

If the traced terminal is not the external output terminal, it is determined whether or not the traced terminal is the input terminal of a register (Step S8). If the traced terminal is the input terminal of the register (step S8), the attribute of the input terminal of the register is determined (Step S9). That is, it is determined that the attribute of the input terminal of the register is which of a data input terminal, a set signal input terminal, a reset signal input terminal and a clock signal input terminal. If the traced terminal is the input terminal of the clock signal, the flow goes back to the step S3 to continue the tracing operation. If the traced terminal is the data signal input terminal, the control flow goes back to the step S3 to continue the tracing operation. If the traced terminal is the set or reset signal input terminal, the control flow goes back to the step S1. Thus, the set signal and the reset signal are not excluded from the verification object, but the data signal is excluded from the verification object.

Thus, the processes from the step S1 are repeated for all the external input terminals and the signal transfer paths for the clock signal and the data signal are determined.

In the above, when the data signal is latched by a register, the flags are rest so that the signal transfer path is not determined. The reason is as follows. That is, when a data signal outputted from the register should be latched by a latch in response to the clock signal, the delay of the data signal is determined based on the delay of a clock signal supplied to the register. Also, the slew of the waveform of the data signal outputted from the register is determined at the latch based on the signal data flow.

Next, the evaluating unit 7 calculates waveforms of the clock signals when the clock signals are transferred on the signal transfer paths and a waveform of the data signal when the data signal is transferred on the other signal transfer path.

Figure 9:
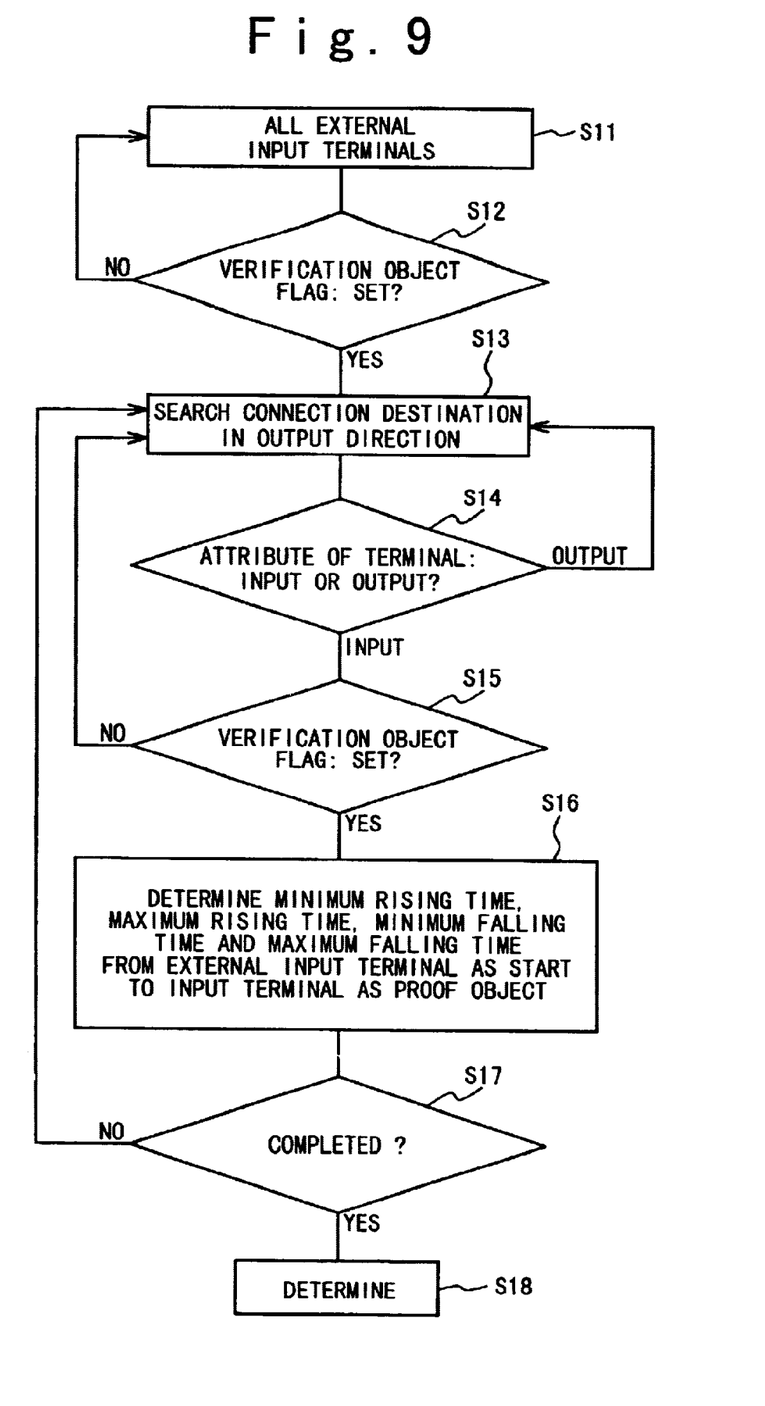
FIG. 9 is a flow chart showing a method of verifying timing.

FIG. 9 shows a method of calculating the delays and slews of the clock signal and data signal, and of evaluating whether the timing is proper or improper between the data signal and the clock signal. Each of the input terminals is sequentially selected (Step S11). If the selected terminal is the terminal for the flag to be set at the step S5 (Step S12), the signal transfer path is traced into the output direction. Subsequently, it is determined whether the attribute of the traced terminal is an input terminal or an output terminal (Steps S13 and S14). If the traced terminal is an object terminal, the control flow advances to a step S15. At the step 15, it is determined whether the verification object flag is set for the traced terminal. If the traced terminal is not the object terminal, the control flow goes back to the step S13. If the traced terminal is the object terminal, a step 16 is carried out. At the step S16, a new delay and new slew for the signal are retrieved from the delay data file 4. Subsequently, new minimum rising time, new maximum rising time, new minimum falling time, and new maximum falling time are calculated based on previous minimum rising time, previous maximum rising time, previous minimum falling time, and previous maximum falling time and the retrieved delay times and retrieved slews. Then, the new minimum rising time, new maximum rising time, new minimum falling time, and new maximum falling time are set as the previous minimum rising time, the previous maximum rising time, the previous minimum falling time, and the previous maximum falling time, respectively. Subsequently, it is determined at a step S17 whether the above calculation is completed over the whole signal transfer path. If being not completed, the control flow goes back to the step S13. If being completed, a step S18 is carried out to evaluate the timing between the data signal and the clock signal.

In this way, the delay and slew of the clock signal from the external input terminal to the object logic cell are determined. Also, the delay and slew of the data signal from the external input terminal to the object logic cell are determined. However, when the data signal is outputted from a previous stage latch circuit, the slew of the data signal from the previous stage latch circuit to the object logic cell is determined. Also, the delay of the data signal is determined based on a clock signal supplied to the previous stage latch circuit.

At the step S18, the evaluating unit 7 evaluates whether a timing between a data signal supplied to an object one of the logic cells and a clock signal supplied to the object logic cell is proper or improper. In other words, the evaluating unit 7 evaluates based on the above equations whether a predetermined signal portion of the waveform of the data signal and a predetermined signal portion of the waveform of the clock signal overlap with each other.

As described above, according to the present invention, a pulse width depending on a frequency and a slew having correlation with the delay are considered in the timing verification.

What is claimed is:

1. A method for verifying a timing at an object logic cell between a first signal and a second signal in a logic circuit with a plurality of logic cells including said object logic cell, comprising:

(a) determining first delay data of said first signal from a first external input terminal to said object logic cell, first waveform slew data of said first signal to said object logic cell and first signal data indicating a frequency, duty ratio and jitter of said first signal, and a second delay data, a second waveform slew data and second signal data indicating a frequency, duty ratio and jitter of said second signal to said object logic cell;

(b) calculating in time, a first portion of a first waveform of said first signal at said object logic cell based on said first delay data, said first waveform slew data and said first signal data;

(c) calculating in time, a second portion of a second waveform of said second signal at said object logic cell based on said second delay data, said second waveform slew data and said second signal data; and (d) evaluating whether said first portion of said first waveform overlaps said second portion of said second waveform.

2. The method according to claim 1, wherein said (a) determining includes:

(e) providing first to third tables, wherein said first table stores delay data associated with signals in said logic circuit, said second table stores waveform slew data associated with said signals in said logic circuit, and said third table previously stores signal data of a frequency, duty ratio and jitter associated with at least one of said signals in said logic circuit; and (f) referring to said first table said based on said first signal and said second signal to determine said first delay data of said first signal and said second delay data of said second signal from said delay data stored in said first table, respectively, to said second table said based on said first signal and said second signal to determine said first waveform slew data of said first signal and said second waveform slew data of said second signal from said waveform slew data stored in said second table, respectively, and to said third table said based on said first and second signals to determine said first and second signal data from said signal data stored in said third table, respectively.

3. The method according to claim 2, wherein said (a) determining further comprises:

(g) providing a fourth table storing net list data indicative of said logic circuit by signal paths and said logic cells; and (h) previously calculating said delay data and said waveform slew data for each of said signal paths and said plurality of logic cells based on said net list data to store in said first and second tables, respectively.

4. The method according to claim 3, wherein said (f) referring includes:

(i) tracing a first transfer path of said first signal from said first external input terminal to said object logic cell using said net list data;

(j) tracing a second transfer path of said second signal from a second external input terminal to said object logic cell using said net list data;

(k) calculating said first delay data of said first signal based on said delay data stored in said first table, said first signal data and said first transfer path;

(l) calculating said first waveform slew data of said first signal based on said waveform slew data stored in said second table, said first signal data and said first transfer path;

(m) calculating said second delay data of said second signal based on said delay data stored in said first table, said second signal data and said second transfer path; and (n) calculating said second waveform slew data of said second signal based on said waveform slew data stored in said second table and said second transfer path.

5. The method according to claim 1, wherein said (b) calculating includes:

calculating a first minimum falling time, a first maximum falling time, a first minimum rising time, and a first maximum rising time for said first portion of said first signal waveform of said first signal at said object logic cell based on said first delay data, said first slew data and said first signal data, said (c) calculating includes:

calculating a second minimum falling time, a second maximum falling time, a second minimum rising time, and a second maximum rising time for said second portion of said second waveform of said second signal at said object logic cell based on said second slew data.

6. The method according to claim 5, wherein said first portion of said first waveform is defined as said first minimum falling time minus said first maximum rising time, said second portion of said second waveform is defined as said second minimum falling time minus said second maximum rising time, and said (d) evaluating includes:

evaluating whether said first portion of said first waveform overlaps said second portion of said second waveform in time.

7. The method according to claim 5, wherein said first portion of said first waveform is defined as said first minimum failing time minus said first maximum rising time, and said second portion of said second waveform is defined as said second minimum rising time minus said second maximum falling time, and said (d) evaluating includes:

evaluating whether said first portion of said first waveform overlaps said second portion of said second waveform in time.

8. The method according to claim 5, wherein said first portion of said first waveform is defined as said first minimum rising time minus said first maximum falling time, and said second portion of said second waveform is defined as said second minimum falling time minus said second maximum rising time, and said (d) evaluating includes:

evaluating whether said first portion of said first waveform overlaps said second portion of said second waveform in time.

9. The method according to claim 5, wherein said first portion of said first waveform is defined as said first minimum rising time minus said first maximum falling time, and said second portion of said second waveform is defined as said second minimum rising time minus said second maximum falling time, and said (d) evaluating includes:

evaluating whether said first portion of said first waveform overlaps said second portion of said second waveform in time.

10. A system for verifying a timing at an object logic cell between a first signal and a second signal in a logic circuit with a plurality of logic cells including said object logic cell, comprising:

a first table which stores delay data associated with signals in said logic circuit;

a second table which stores waveform slew data associated with said signals in said logic circuit;

a third table which previously stores signal data of a frequency, duty ratio and jitter associated with at least one of said signals in said logic circuit; and an evaluating unit which:

refers to said first table based on said first signal and said second signal to determine first delay data of said first signal and said second delay data of said second signal from a first external input terminal to said object logic cell from said delay data stored in said first table, respectively, to said second table said based on said first signal and said second signal to determine said first waveform slew data of said first signal to said object logic cell and said second waveform slew data of said second signal to said object logic cell from said waveform slew data stored in said second table, respectively, and to said third table based on said first and second signals to determine said first and second signal data from said signal data stored in said third table, respectively, calculates in time, a first portion of a first waveform of said first signal at said object logic cell based on said first delay data, said first waveform slew data and said first signal data, calculates in time, a second portion of a second waveform of said second signal at said object logic cell based on said second delay data, said second waveform slew data and said second signal data, and evaluates whether said first portion of said first waveform overlaps said second portion of said second waveform.

11. The system according to claim 10, further comprising a fourth table which stores net list data indicative of said logic circuit by signal paths and said logic cells, and wherein said evaluating unit previously calculates said delay data and said waveform slew data for each of said signal paths and said plurality of logic cells based on said net list data to store in said first and second tables, respectively.

12. The system according to claim 11, wherein said evaluating unit:

traces a first transfer path of said first signal from said first external input terminal to said logic cell using said net list data;

traces a second transfer path of said second signal from a second external input terminal to said object logic cell using said net list data;

calculates said first delay data of said first signal based on said delay data stored in said first table, said first signal data and said first transfer path;

calculates said first waveform slew data of said first signal based on said waveform slew data stored in said second table, said first signal data and said first transfer path;

calculates said second delay data of said second signal based on said delay data stored in said first table, said second signal data and said second transfer path; and calculates said second waveform slew data of said second signal based on said second delay data, said waveform slew data stored in said second table and second transfer path.

13. The system according to claim 10, wherein said evaluating unit:

calculates a first minimum falling time, a first maximum falling time, a first minimum rising time, and a first maximum rising time for said first portion of said first signal waveform of said first signal at said object logic cell based on said first delay data, said first slew data and said first signal data, and calculates a second minimum falling time, a second maximum falling time, a second minimum rising time, and a second maximum rising time for said second portion of said second waveform of said second signal at said object logic cell based on said second slew data.

14. The system according to claim 13, wherein said evaluating unit evaluates whether said first portion of said first waveform overlaps said second portion of said second waveform in time, based on one of said first minimum falling time minus said first maximum rising time and said first maximum rising time minus said first minimum falling time and one of said second minimum falling time minus said second maximum rising time and said second maximum rising time minus said second minimum falling time.

15. A recording medium in which a program is recorded for a method for verifying a timing at an object logic cell between a first signal and a second signal in a logic circuit with a plurality of logic cells including said object logic cell, wherein said method comprises:

(a) determining first delay data of said first signal from a first external input terminal to said object logic cell, first waveform slew data of said first signal to said object logic cell and first signal data indicating a frequency, duty ratio and jitter of said first signal and a second waveform slew data and second signal data indicating a frequency, duty ratio and jitter of said second signal to said object logic cell;

(b) calculating in time, a first portion of a first waveform of said first signal at said object logic cell based on said first delay data, said first waveform slew data and said first signal data;

(c) calculating in time, a second portion of a second waveform of said second signal at said object logic cell based on said second delay data, said second waveform slew data and said second signal data; and (d) evaluating whether said first portion of said first waveform overlaps said second portion of said second waveform.

16. The recording medium according to claim 15, wherein said (a) determining includes:

(e) providing first to third tables, wherein said first table stores delay data associated with signals in said logic circuit, said second table stores waveform slew data associated with said signals in said logic circuit, and said third table previously stores signal data of a frequency, duty ratio and jitter associated with at least one of said signals in said logic circuit; and (f) referring to said first table said based on said first signal and said second signal to determine said first delay data of said first signal and said second delay data of said second signal from said delay data stored in said first table, respectively, to said second table said based on said first signal and said second signal to determine said first waveform slew data of said first signal and said second waveform slew data of said second signal from said waveform slew data stored in said second table, respectively, and to said third table said based on said first and second signals to determine said first and second signal data from said signal data stored in said third table, respectively.

17. The recording medium according to claim 16, wherein said (a) determining further comprises:

(g) providing a fourth table storing net list data indicative of said logic circuit by signal paths and said logic cells; and (h) previously calculating said delay data and said waveform slew data for each of said signal paths and said plurality of logic cells based on said net list data to store in said first and second tables, respectively.

18. The recording medium according to claim 17, wherein said (f) referring includes:

(i) tracing a first transfer path of said first signal from said first external input terminal to said object logic cell using said net list data;

(j) tracing a second transfer path of said second signal from a second external input terminal to said object logic cell using said net list data;

(k) calculating said first waveform slew data 10 of said first signal based on said waveform slew data stored in said second table, said first signal data and said first transfer path;

(l) calculating said first waveform slew data of said first signal based on said waveform slew data stored in said second table, said first signal data and said first transfer path;

(m) calculating said second delay data of said second signal based on said delay data stored in said first table, said second signal data and said second transfer path; and (n) calculating said second waveform slew data of said second signal based on said waveform slew data stored in said second table and second transfer path.

19. The recording medium according to claim 15, wherein said (b) calculating includes:

calculating a first minimum falling time, a first maximum falling time, a first minimum rising time, and a first maximum rising time for said first portion of said first signal waveform of said first signal at said object logic cell based on said first delay data, said first slew data and said first signal data, said (a) calculating includes:

calculating a second minimum falling time, a second maximum falling time, a second minimum rising time, and a second maximum rising time for said second portion of said second waveform of said second signal at said object logic cell based on said second slew data.

20. The recording medium according to claim 19, wherein said first portion of said first waveform is defined as said first minimum falling time minus said first maximum rising time, said second portion of said second waveform is defined as said second minimum falling time minus said second maximum rising time, and said (d) evaluating includes:

evaluating whether said first portion of said first waveform overlaps said second portion of said second waveform in time.

21. The recording medium according to claim 19, wherein said first portion of said first waveform is defined as said first minimum falling time minus said first maximum rising time, and said second portion of said second waveform is defined as said second minimum rising time minus said second maximum falling time, and said (d) evaluating includes:

evaluating whether said first portion of said first waveform overlaps said second portion of said second waveform in time.

22. The recording medium according to claim 19, wherein said first portion of said first waveform is defined as said first minimum rising time minus said first maximum falling time, and said second portion of said second waveform is defined as said second minimum falling time minus said second maximum rising time, and said (d) evaluating includes:

evaluating whether said first portion of said first waveform overlaps said second portion of said second waveform in time.

23. The recording medium according to claim 19, wherein said first portion of said first waveform is defined as said first minimum rising time minus said first maximum falling time, and said second portion of said second waveform is defined as said second minimum rising time said second maximum falling time, and said (d) evaluating includes:

evaluating whether said first portion of said first waveform overlaps said second portion of said second waveform in time.

* * * * *